US009681575B2

(12) United States Patent
Bharucha et al.

(10) Patent No.: US 9,681,575 B2
(45) Date of Patent: Jun. 13, 2017

(54) ENHANCED RACK DESIGN TO IMPROVE COMPONENT AND CABLE ACCESS

(71) Applicant: International Business Machines Corporation, Armonk, NY (US)

(72) Inventors: Meher A. Bharucha, Rochester, MN (US); Paul W. Schaefer, Rochester, MN (US); Sandra J. Shirk/Heath, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 207 days.

(21) Appl. No.: 14/532,473

(22) Filed: Nov. 4, 2014

(65) Prior Publication Data

US 2016/0128224 A1 May 5, 2016

(51) Int. Cl.
H05K 7/14 (2006.01)
H05K 7/16 (2006.01)
H05K 7/12 (2006.01)

(52) U.S. Cl.
CPC ............ H05K 7/1491 (2013.01); H05K 7/12 (2013.01); H05K 7/16 (2013.01)

(58) Field of Classification Search
CPC .. H05K 7/14; H05K 7/16; H05K 7/12; H05K 7/1491; H05K 7/1417
USPC ....................................................... 147/72 A
See application file for complete search history.

(56) References Cited

U.S. PATENT DOCUMENTS

| 7,480,154 | B2* | 1/2009 | Lawrence ............ H05K 7/1491 174/72 A |
| 7,974,105 | B2 | 7/2011 | Dean, Jr. et al. |
| 8,033,406 | B2 | 10/2011 | Mattlin et al. |
| 8,040,693 | B2 | 10/2011 | Blomquist |
| 8,173,898 | B2 | 5/2012 | Rasmussen et al. |
| 2004/0231875 | A1* | 11/2004 | Rasmussen ............. G06F 1/189 174/50 |
| 2007/0086720 | A1 | 4/2007 | Morris |
| 2009/0201642 | A1* | 8/2009 | Diaz .................. H05K 7/20581 361/695 |
| 2011/0150408 | A1 | 6/2011 | Fewster et al. |
| 2012/0008285 | A1 | 1/2012 | Renkel, Jr. et al. |
| 2012/0044958 | A1 | 2/2012 | Raghavan et al. |
| 2013/0039001 | A1 | 2/2013 | Jau et al. |

(Continued)

FOREIGN PATENT DOCUMENTS

EP        2019580 A2    1/2009

OTHER PUBLICATIONS

"Applying Proper Cable Management in IT Racks", 2012 Emerson Electric Company.

(Continued)

*Primary Examiner* — Eric Thomas
*Assistant Examiner* — Michael P McFadden
(74) *Attorney, Agent, or Firm* — Joan Pennington

(57) ABSTRACT

A method and apparatus for implementing enhanced rack design to improve component and cable access in a computer system. A server rack includes a side rack cable access area. An elongated bracket member includes multiple openings for receiving cable ties. The cables ties are used to secure predefined cables. The elongated bracket member is unlatched from an inside wall of the rack. The elongated bracket member together with the secured system cables is pivoted away from customer cables routing area.

7 Claims, 14 Drawing Sheets

(56) References Cited

U.S. PATENT DOCUMENTS

2013/0301225 A1* 11/2013 Gong .................. H05K 7/1491
                                                                    361/729
2015/0078253 A1    3/2015  Morosawa et al.
2015/0103488 A1    4/2015  Tanaka

OTHER PUBLICATIONS

"HP Proliant DL360 Gen8 Server Cable Routing Methods", 2012 Hewlett-Packard Development Company, L.P.
Appendix P—List of IBM Patents or Patent Applications Treated As Related—Mar. 27, 2016.

* cited by examiner

PRIOR ART

ENHANCED RACK DESIGN TO IMPROVE COMPONENT AND CABLE ACCESS

FIELD OF THE INVENTION

The present invention relates generally to the data processing field, and more particularly, relates to a method and apparatus for implementing enhanced rack design to improve component and cable access.

DESCRIPTION OF THE RELATED ART

When servers are integrated into a rack, traditionally the manufacturer installs a set of base system cables before shipping the server system to the customer. The customer then installs the rest of their I/O cables. Traditionally, to ease the customer's installation process, base cables are installed in the innermost corner of the rack side wall cabling space. This allows space for customers to easily install their own cables.

Referring to FIGS. 4A, 4B, and 4C typical cabling in an example prior art rack design are shown. As shown in the respective rack top views of FIGS. 4A and 4B, and in the rack back view of FIG. 4C, areas near an outer side wall of the inside of the server rack are blocked to rear access making it impossible or difficult to add and/or service cables.

On many servers the base cable bulk wire is significantly thicker than the customer I/O cables and consequently the bend radius of the base system cables consumes much of the cable space in the side walls. Because of this increase in bend radius, customers are left with less room to add customer I/O cables. Currently customers must either decrease processing power to reduce the number of cables or add rack extensions. However, these solutions are unfeasible for several customers, such as ones with limited floor space, or ones who require the more processing power.

A need exists for an effective mechanism for implementing an increase in processing power without adding any extensions when using high bulk wire in a server rack design.

SUMMARY OF THE INVENTION

Principal aspects of the present invention are to provide a method and apparatus for implementing enhanced rack design to improve component and cable access in a computer system. Other important aspects of the present invention are to provide such method and apparatus substantially without negative effects and that overcome many of the disadvantages of prior art arrangements.

In brief, a method and apparatus for implementing enhanced rack design to improve component and cable access in a computer system. A server rack includes a side rack cable access area. An elongated bracket member includes multiple openings for receiving cable ties. The cables ties are used to secure predefined cables. The elongated bracket member is unlatched from an inside wall of the rack. The elongated bracket member together with the secured system cables is pivoted away from customer cables routing area.

In accordance with features of the invention, the elongated bracket member together with secured system cables is unlatched from the rack and pivoted without disconnecting the secured predefined cables.

In accordance with features of the invention, when the elongated bracket member is unlatched, the bracket is free to move as far as a cable service loop allows.

In accordance with features of the invention, one or more of the secured system cables optionally are removed from the elongated bracket member for maintenance to be performed.

In accordance with features of the invention, the elongated bracket member is latched to an inside wall of the rack with a minimized bend radius of the secured predefined cables.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and apparatus are provided for implementing enhanced rack design to improve component and cable access in a computer system.

Figure 1:
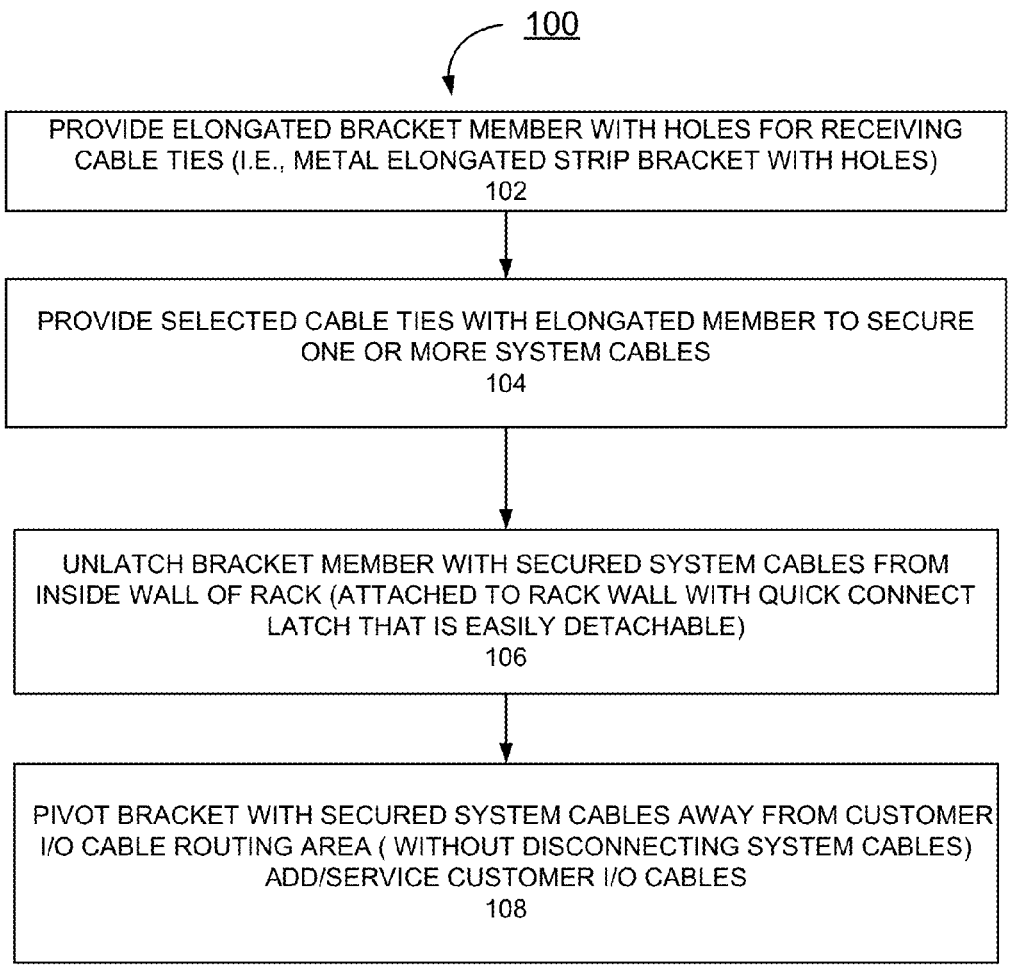
FIG. 1 is a flow chart illustrating an example functional operations of a method, and apparatus for implementing enhanced rack design to improve component and cable access in a computer system in accordance with a preferred embodiment.

Having reference now to the drawings, in FIG. 1, there is shown example functional operations for implementing enhanced rack design generally designated by the reference character 100 to improve component and cable access in a computer system in accordance with a preferred embodiment.

Referring also to FIGS. 2A, 2B, 2C, and 2D, example apparatus generally designated by the reference character 200 is shown (not to scale) for implementing enhanced rack design to improve component and cable access in a computer system in accordance with a preferred embodiment.

As indicated in a block 102, an elongated bracket member having a plurality of holes for receiving cable ties is provided. For example, a metal elongated strip bracket or a stamped and formed hard plastic elongated strip bracket with holes is provided. A bracket 206 such as illustrated in FIGS. 2A, 2B, 2C, and 2D, implements the elongated bracket member.

As indicated in a block 104, cable ties are provided with selected holes of the elongated bracket member to secure one or more system cables, such as server base system cables. The cable ties secure predefined cables, such as cables 204 such as illustrated in FIGS. 2A, 2B, 2C, and 2D.

As indicated in a block 106, the elongated bracket member with the secured system cables is unlatched from an inside wall corner of the rack. For example, a quick connect latch is used to attach the elongated bracket member at an inside server wall location, such as indicated by quick-connect latch 210 in FIG. 2A.

Figure 2A:
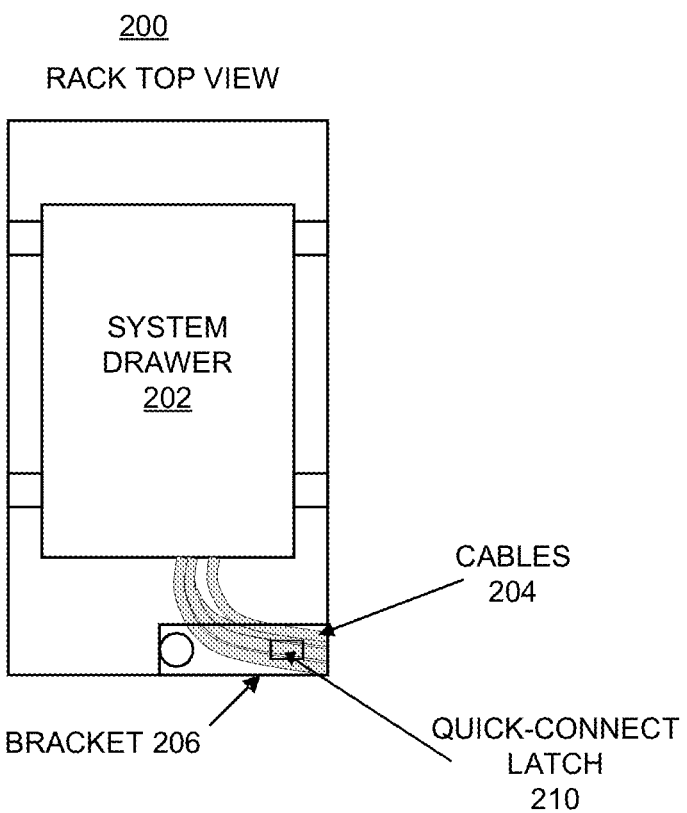
FIGS. 2A, 2B, 2C, and 2D schematically illustrate not to scale example apparatus for implementing enhanced rack design to improve component and cable access in a computer system in accordance with a preferred embodiment.
Figure 2B:
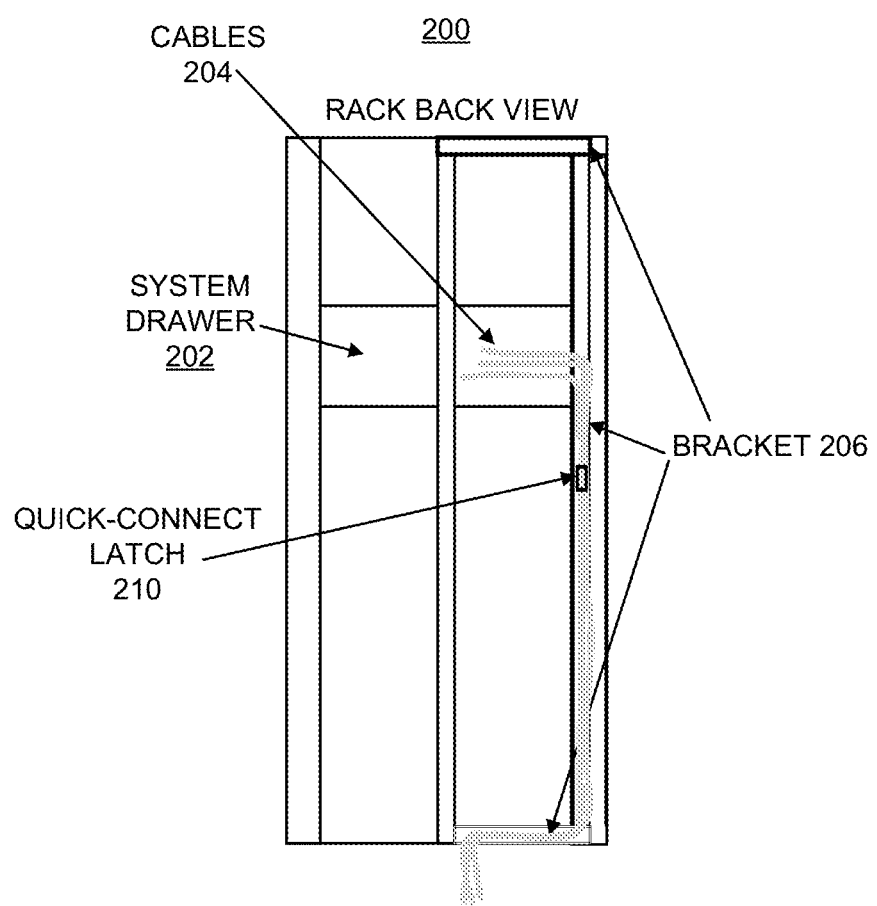
Figure 2C:
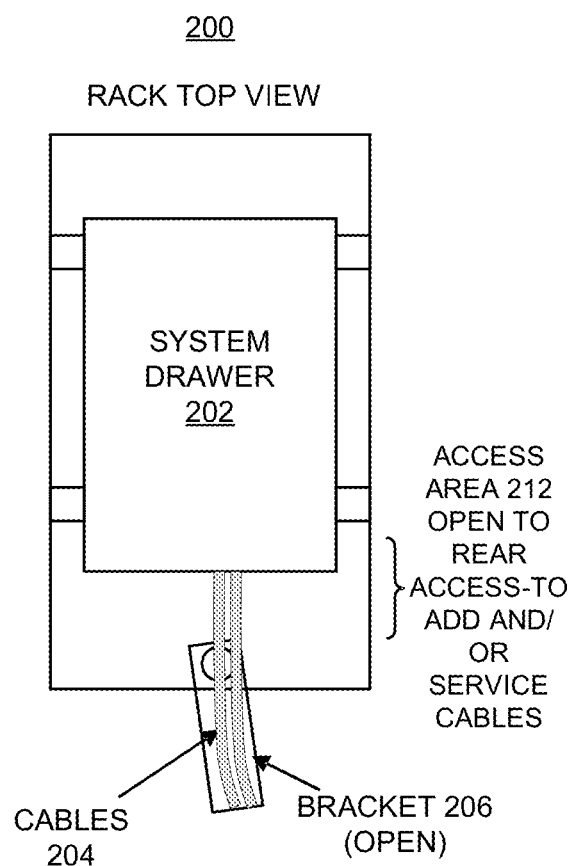
Figure 2D:
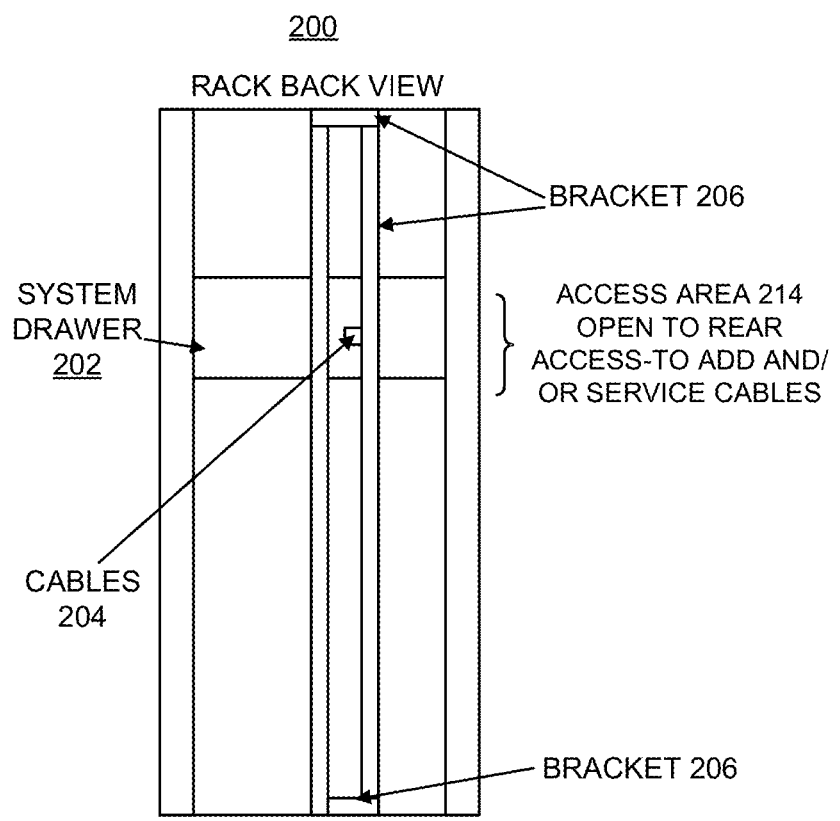

As indicated in a block 108, the bracket is pivoted with the secured system cables providing access to a customer I/O cable routing area. The unlatched bracket can be pivoted as far as cable service loop allows, for example to add and/or service cables without disconnecting system cables. In FIG. 2A, the bracket 206 is shown in the closed position. In FIG. 2C, the bracket 206 is shown in the open position with the bracket disconnected from the server rack to provide access area 212 open to rear access to add and/or service customer cables. In the rack back view of FIG. 2D, an access area 214 open to rear access to add and/or service customer cables is indicated.

Figure 3A:
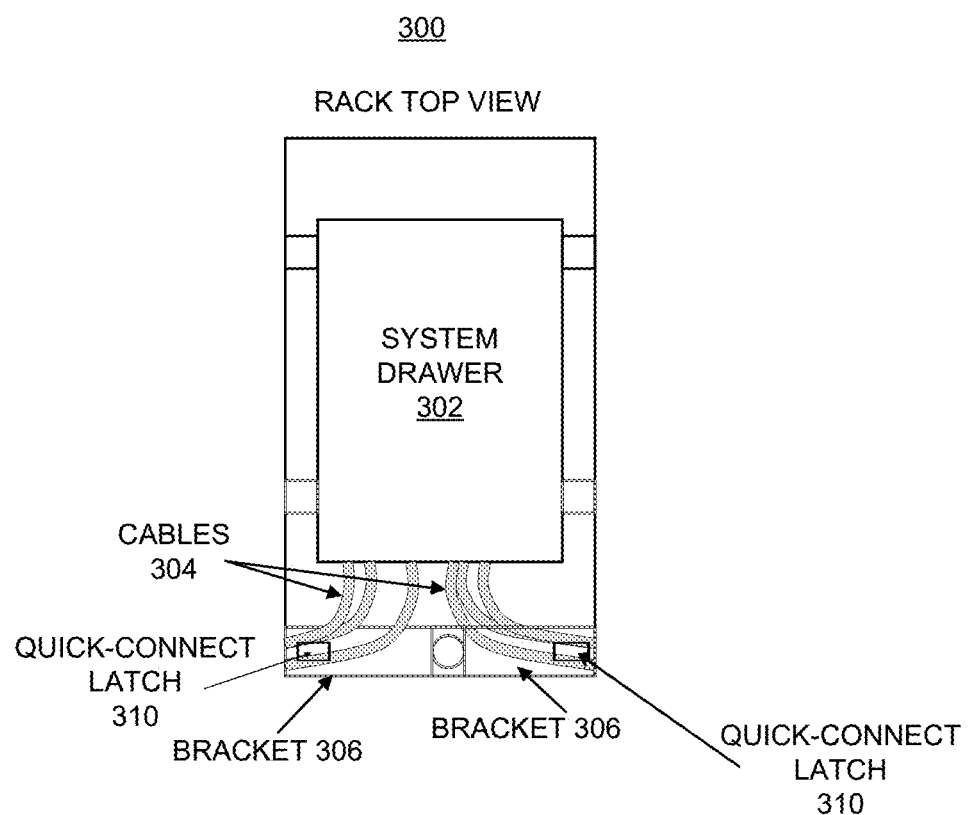
FIGS. 3A, 3B, 3C, 3D, 3E and 3F schematically illustrate not to scale further example apparatus for implementing enhanced rack design to improve component and cable access in a computer system in accordance with a preferred embodiment.
Figure 3B:
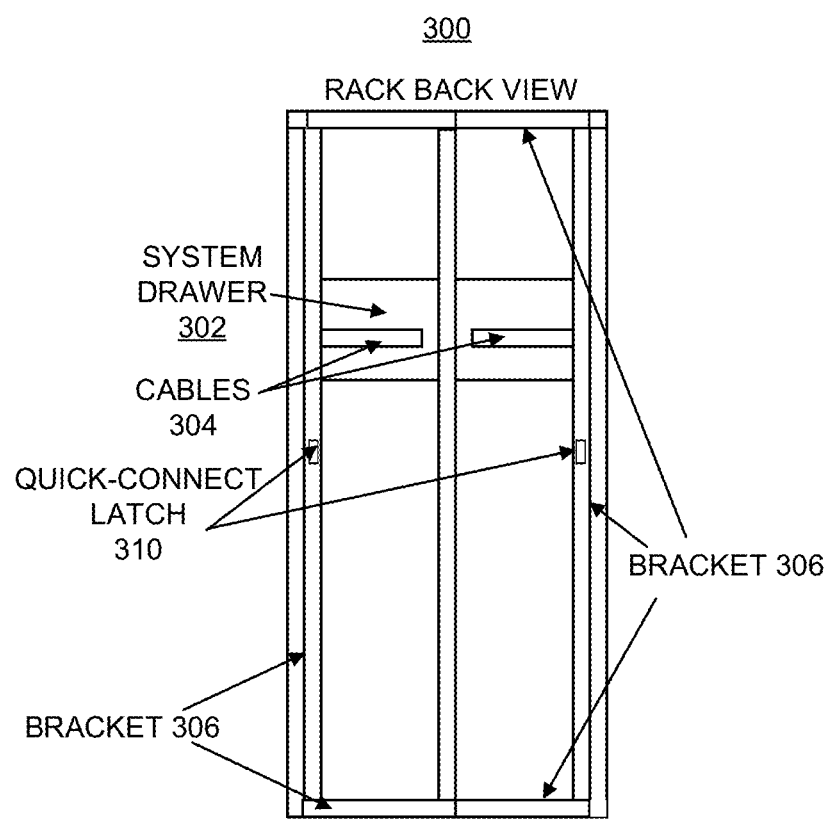
Figure 3C:
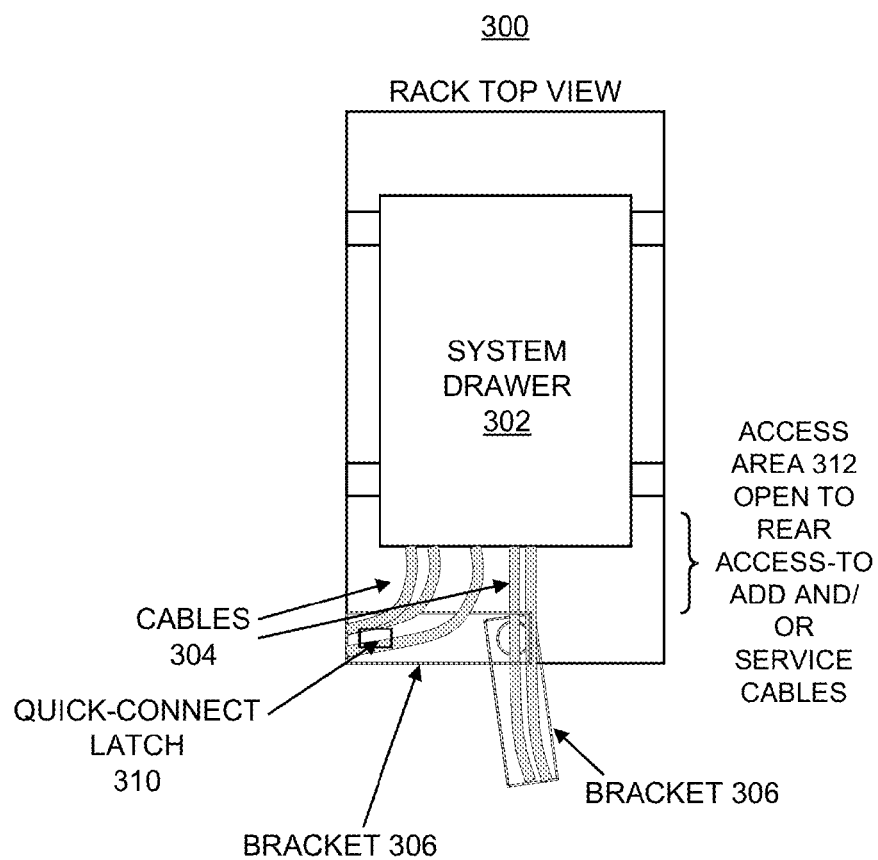

Referring now to FIGS. 3A, 3B, 3C, 3D, 3E and 3F, further example apparatus generally designated by the reference character 300 is shown for implementing enhanced rack design to improve component and cable access in a computer system in accordance with a preferred embodiment. FIGS. 3A and 3C provide rack top views of example apparatus 300. FIGS. 3B, 3D, 3E, and 3F provide rack rear views of example apparatus 300.

Apparatus 300 includes a system drawer 302, predefined base server system cables 304, and dual sided brackets 306, each with a respective quick-connect latch 310.

As shown in FIG. 3A, both brackets 306 are shown in the closed position. In FIG. 3C, the bracket 306 on the right side is shown in the open position with the bracket disconnected from the server rack to provide access for customer cables as indicated by access area 312 open to rear access to add and/or service cables.

Figure 3D:
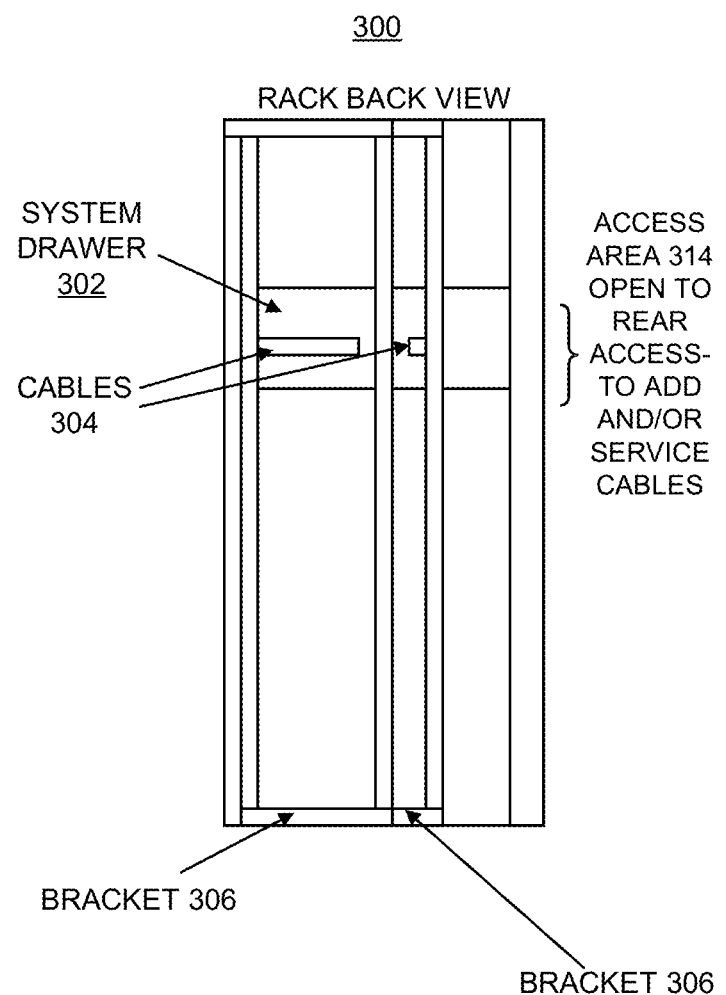
Figure 3E:
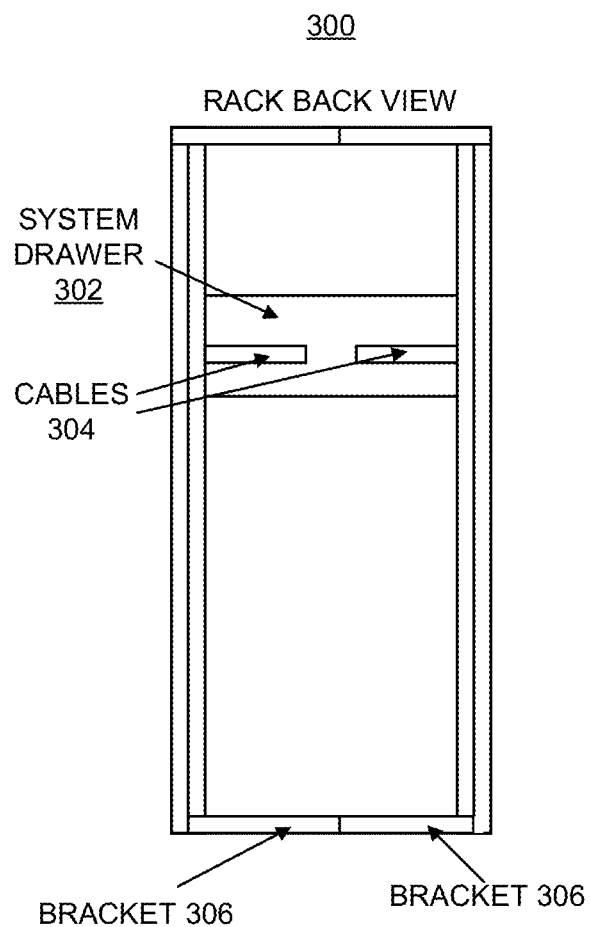

In a rack rear view of FIG. 3D, an access area 314 is illustrated that is open to rear access to add and/or service cables.

Figure 3F:
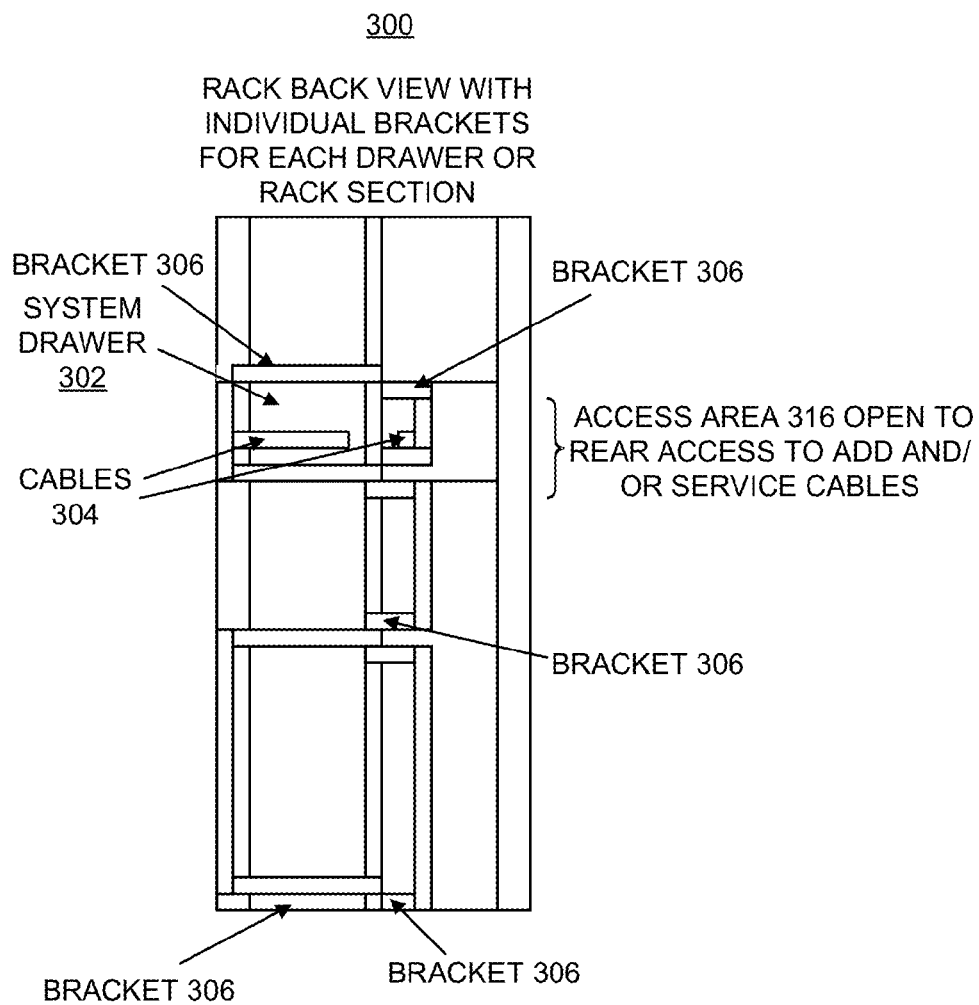
Figure 4A:
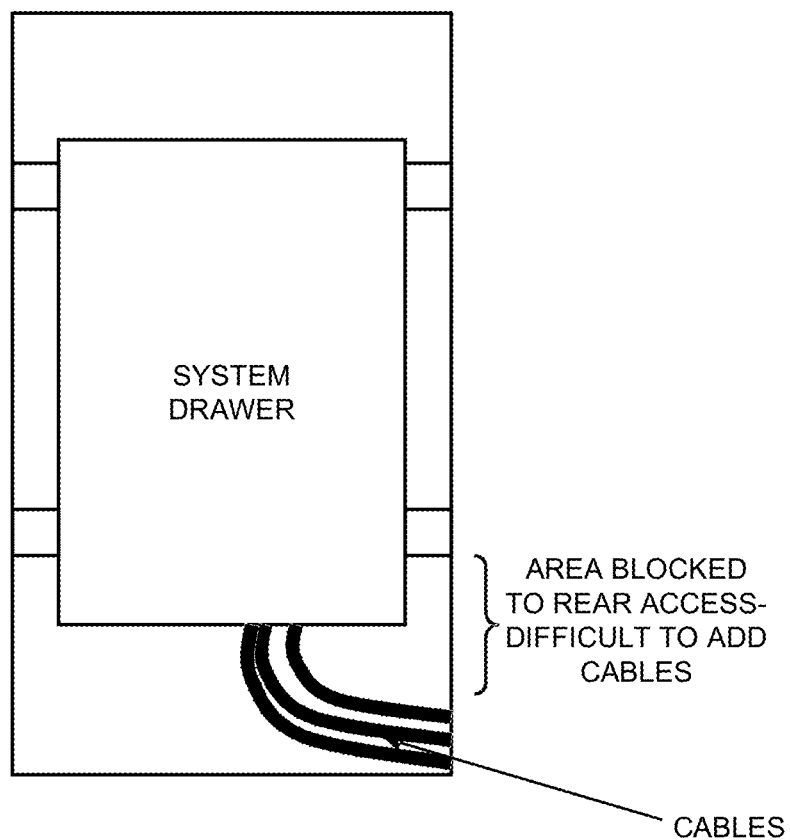
FIGS. 4A, 4B, and 4C schematically illustrate not to scale example prior art rack design apparatus.
Figure 4B:
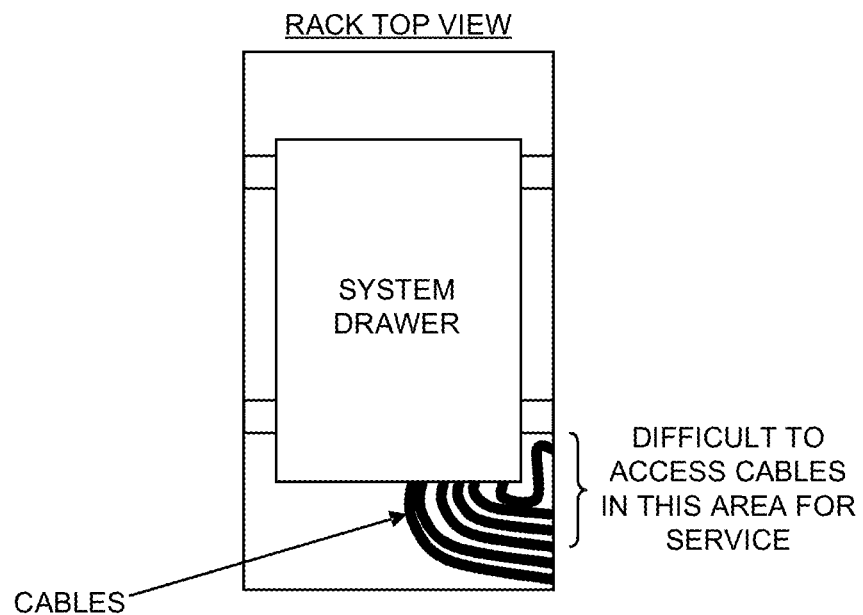
Figure 4C:
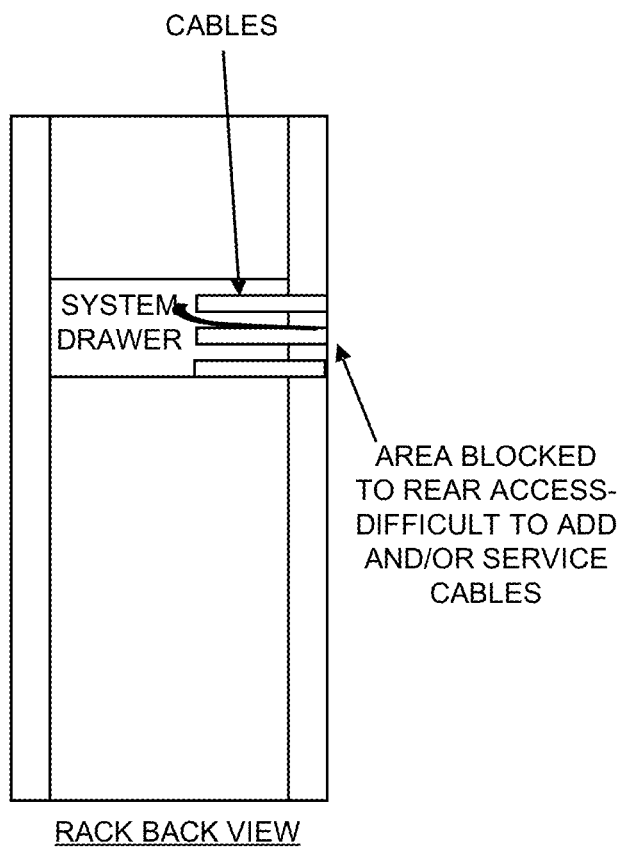

In a rack rear view of FIG. 3F that illustrating brackets 306 for each drawer or rack section, an access area 316 is illustrated that is open to rear access to add and/or service cables.

In accordance with features of the invention, the enhanced rack design enables improved component and cable access in a computer system where the base server system cables never need to be removed from the bracket unless maintenance needs to be performed on the base server system cables. Each bracket 206, 306 attached to the outer edge of the inside corner wall of the rack is easily unlatched. When the bracket 206, 306 is unlatched, the bracket is free to pivot as far as the cable service loop allow, providing an access area open to rear access to add and/or service customer cables.

While the present invention has been described with reference to the details of the embodiments of the invention shown in the drawing, these details are not intended to limit the scope of the invention as claimed in the appended claims.

What is claimed is:

1. An apparatus for implementing enhanced server rack design in a computer system comprising: a server rack including a side rack cable access area; an elongated bracket member including multiple openings for receiving cable ties; cables ties received in selected opening to secure multiple predefined cables to the elongated bracket member, the secured predefined cables including server system cables; a latch attaching the elongated bracket member and the secured predefined cables to a location at an innermost corner of an inside wall corner of a side wall of the rack in a closed position; the elongated bracket member together with the secured predefined cables being unlatched from the innermost corner of the inside wall corner of the side wall of the rack providing the elongated bracket free to pivot; and the elongated bracket member including the secured predefined cables with the secured cables being pivoted away from a customer cable routing area proximate to the innermost corner of the inside wall corner of the side wall of the rack in an open position, without disconnecting the secured predefined cables and providing access to a customer input output (I/O) cable routing area to add and service customer I/O cables; wherein a pivot point of the elongated bracket member is located approximately at a central point between the server rack side walls.

2. The apparatus as recited in claim 1, includes a quick connect latch used to attach the elongated bracket member to the inside wall of the rack.

3. The apparatus as recited in claim 1, wherein said elongated bracket member includes a metal elongated bracket member including multiple openings for receiving cable ties.

4. The apparatus as recited in claim 1, wherein said elongated bracket member includes a plastic elongated bracket member including multiple openings for receiving cable ties.

5. The apparatus as recited in claim 1, wherein the secured cables include secured base server system cables.

6. The apparatus as recited in claim 1, wherein the pivoted elongated bracket member together with the secured predefined cables is free to move as far as a cable service loop allows.

7. The apparatus as recited in claim 1, includes a quick connect latch latching the elongated bracket member to an outer edge of the inside wall of the rack.

* * * * *